(12) United States Patent
Wang

(10) Patent No.: US 6,566,021 B2
(45) Date of Patent: May 20, 2003

(54) FLUOROPOLYMER-COATED PHOTOMASKS FOR PHOTOLITHOGRAPHY

(75) Inventor: Ching-Bore Wang, Fremont, CA (US)

(73) Assignee: Micro Lithography, Inc., Sunnyvale, CA (US)

(*) Notice: Subject to any disclaimer, the term of this patent is extended or adjusted under 35 U.S.C. 154(b) by 0 days.

(21) Appl. No.: 09/916,732

(22) Filed: Jul. 26, 2001

(65) Prior Publication Data

US 2003/0022073 A1 Jan. 30, 2003

(51) Int. Cl.[7] .................................................. G03F 9/00
(52) U.S. Cl. ...................................................... 430/5
(58) Field of Search ........................ 430/5, 271, 273.1; 359/507, 511; 428/422

(56) References Cited

U.S. PATENT DOCUMENTS

| | | | |
|---|---|---|---|
| 4,399,264 A | 8/1983 | Squire | 526/247 |
| 4,530,569 A | 7/1985 | Squire | 350/96.34 |
| 4,754,009 A | 6/1988 | Squire | 526/247 |
| 4,935,477 A | 6/1990 | Squire | 526/247 |
| 4,948,851 A | 8/1990 | Squire | 526/247 |
| 4,975,505 A | 12/1990 | Squire | 526/247 |
| 4,977,008 A | 12/1990 | Squire | 428/35.7 |
| 4,982,056 A | 1/1991 | Squire | 174/258 |
| 4,985,308 A | 1/1991 | Squire | 428/422 |
| 5,000,547 A | 3/1991 | Squire | 350/409 |
| 5,051,114 A | 9/1991 | Nemser et al. | 55/16 |
| 5,076,659 A | 12/1991 | Bekiarian et al. | 385/143 |
| 5,276,121 A | 1/1994 | Resnick | 526/247 |
| 5,296,283 A | 3/1994 | Froggatt | 428/204 |
| 5,308,685 A | 5/1994 | Froggatt | 428/204 |
| 5,310,838 A | 5/1994 | Hung et al. | 526/245 |
| 5,356,739 A * | 10/1994 | Kawasaki et al. | 430/5 |
| 5,667,726 A * | 9/1997 | Miyazaki et al. | 252/315.2 |
| 6,057,080 A * | 5/2000 | Brunsvold et al. | 430/273.1 |

FOREIGN PATENT DOCUMENTS

| | | |
|---|---|---|
| JP | 62085251 | 4/1987 |
| JP | 07-281420 | 10/1995 |

OTHER PUBLICATIONS

Grenon et al., "Formation and Detection of Sub–Pellicle Defects by Exposure to DUV System Illumination" SPIE vol. 3873, 162–176 (1999).

* cited by examiner

Primary Examiner—S. Rosasco
(74) Attorney, Agent, or Firm—Kolisch Hartwell, P.C.

(57) ABSTRACT

Photomasks for photolithographic processes are described that incorporate a protective amorphous poly(fluorocarbon) film on their surface, the film serving to reduce contamination at the photomask surface. The preparation of the coated photomasks is also described, as is their use in a photolithographic process.

22 Claims, 3 Drawing Sheets

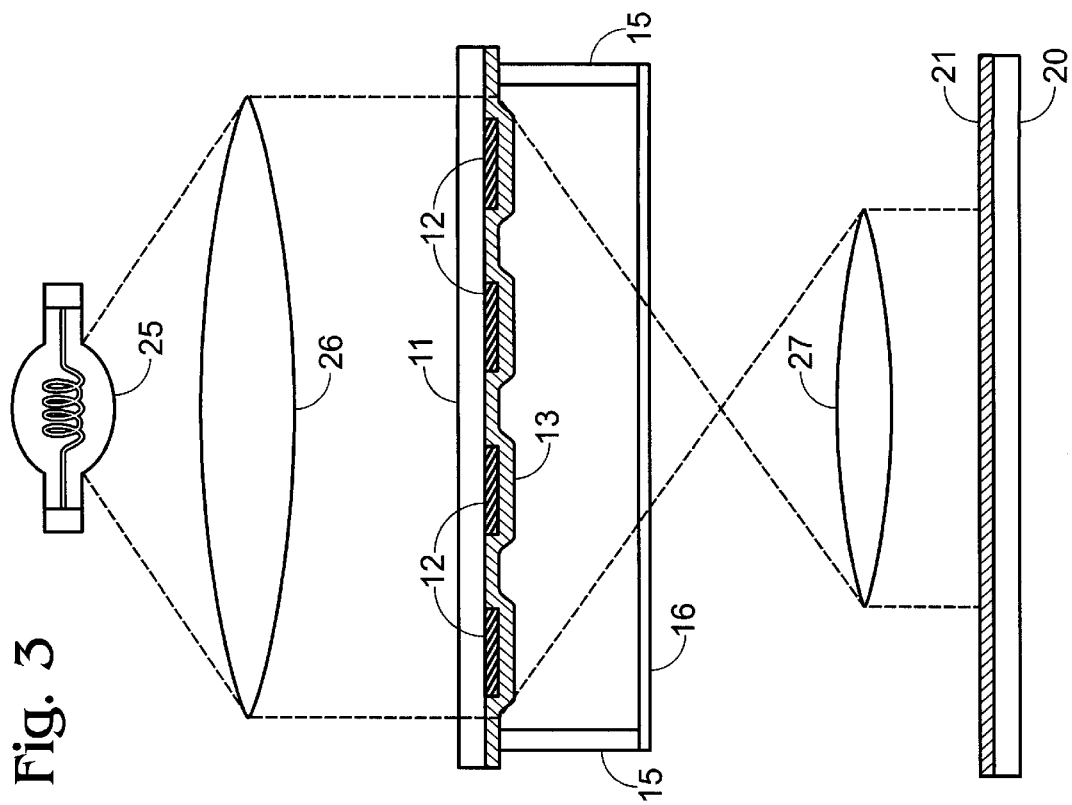
Fig. 3
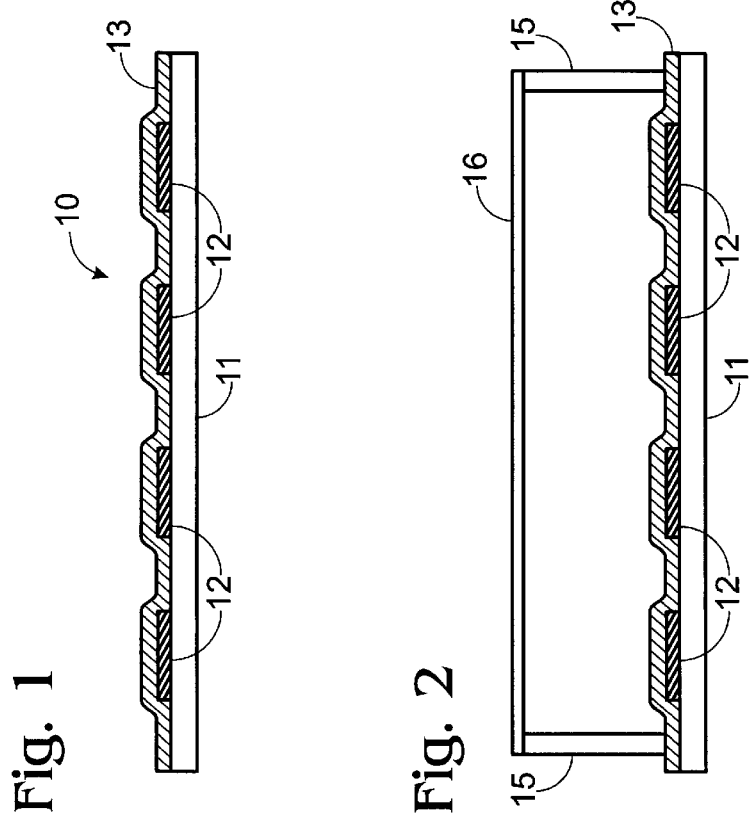
Fig. 1
Fig. 2

FLUOROPOLYMER-COATED PHOTOMASKS FOR PHOTOLITHOGRAPHY

FIELD OF THE INVENTION

The invention relates to photomasks useful in the photolithographic fabrication of semiconductors. In particular, photomasks that are coated with a thin film of chemically inert poly(fluorocarbon) polymer.

BACKGROUND OF THE INVENTION

The manufacture of semiconductor devices typically involves applying a layer of a photosensitive substance (a photoresist) to the surface of an target wafer. The photoresist is then exposed to light in a selected pattern using a photomask, and the photoresist is then developed to leave exposed regions of wafer. These regions are subsequently etched away or otherwise modified, and the residual photoresist is removed. The pattern of the photomask typically possesses extremely fine details, and the presence of even tiny particles on the surface of the photomask can interfere with the accurate reproduction of the pattern on the target wafer.

To minimize particulate contamination at the mask surface, optical pellicles have been developed that protect the photomask. An optical pellicle is a frame-mounted transparent membrane that is attached to the photomask surface, so that contaminating particles fall onto the pellicle membrane and not the surface of the photomask. The pellicle frame holds the pellicle membrane at a sufficient distance above the mask surface so that any particles that may fall upon the membrane lie outside the focal plane of the illuminating light, and so fail to interfere with the projected mask pattern. The use of optical pellicles in semiconductor manufacture has helped mitigate the effects of contamination by dust and other particulates, and has become widespread in the industry.

However, constant demand for smaller, faster, and more powerful microprocessors has required the semiconductor industry to fabricate smaller and smaller semiconductor circuits. Manufacturing techniques have advanced to the point that the size of the circuits being produced is effectively limited by the wavelength of light used in the photolithographic process, with shorter wavelength radiation permitting finer details in the resulting circuit structure. Thus, photolithography using 248 nm, 193 nm, and 157 nm (Deep Ultra-Violet, or DUV) illumination has become common, and even the use of 13.5 nm (Extreme Ultra-Violet, or EUV) illumination is known.

However, as the wavelength of the radiation used decreases, the energy of that light increases. Many airborne organic compounds that were benign at longer wavelengths will become photolytically activated when exposed to energetic ultra-violet illumination. For example, light with a wavelength of 248 nm reacts with most halogenated organic compounds, and may interact with some non-halogenated organic compounds. Light having a wavelength of 193 nm reacts readily with a wide range of organic airborne contaminants, and 157 nm light is efficiently absorbed by and generates reactions with even the moisture present in air. The reactive breakdown products of these reactions interact with the mask pattern, resulting in the generation of a variety of defects.

Unfortunately, the source of many of these potential contaminants is the optical pellicle itself. Volatile components are released from the pellicle membrane, from various anti-reflective coatings on the pellicle membrane, from the anodized surface of the pellicle frame, or from the adhesives used to attach the pellicle membrane to the frame or the frame to the photomask. These contaminants are essentially trapped in the space beneath the pellicle membrane, even when vents are present in the pellicle frame. Repeated exposure of these contaminants to UV illumination results in the generation of chemically reactive species, and the creation of defects on the photomask. The generation of such reactive species dramatically shortens the lifetime of the photomask, as any defects being generated could be transferred to the photoresist, with the resulting production of flawed circuit patterns. Manufacturers are faced with either frequent replacement of photomasks, or the potential generation of defective products. In either case, manufacturing costs increase and quality controls must be tightened.

The continuing necessity of protecting the photomask from particulate contamination requires that optical pellicles continue to be used. What is needed is a method of protecting the photomask and its mask pattern from the reactive contaminants that are generated during illumination that does not itself compromise the utility of the photomask, and is compatible with existing optical pellicles and manufacturing techniques. The use of the photomasks of the invention permits illumination at highly energetic UV wavelengths, while minimizing the interaction of particulate or reactive contaminants with the surface of the photomask.

SUMMARY OF THE INVENTION

Coated photomasks for photolithographic processes, where the photomask includes a transparent substrate with a pattern on the surface of the substrate defining light-transmitting and non-transmitting portions, and a protective film on the surface of the photomask comprising an amorphous poly(fluorocarbon). The invention also includes the preparation of the coated photomasks, and the use of the coated photomasks in a photolithographic process.

BRIEF DESCRIPTION OF THE DRAWINGS

FIG. 1 is a sectional view of a photomask according to the present invention.

FIG. 2 is a sectional view of a photomask according to the present invention that includes a mounted optical pellicle.

FIG. 3 is a schematic depiction of a photolithographic process using a photomask according to the present invention.

DETAILED DESCRIPTION AND BEST MODE OF THE INVENTION

Figure 4:
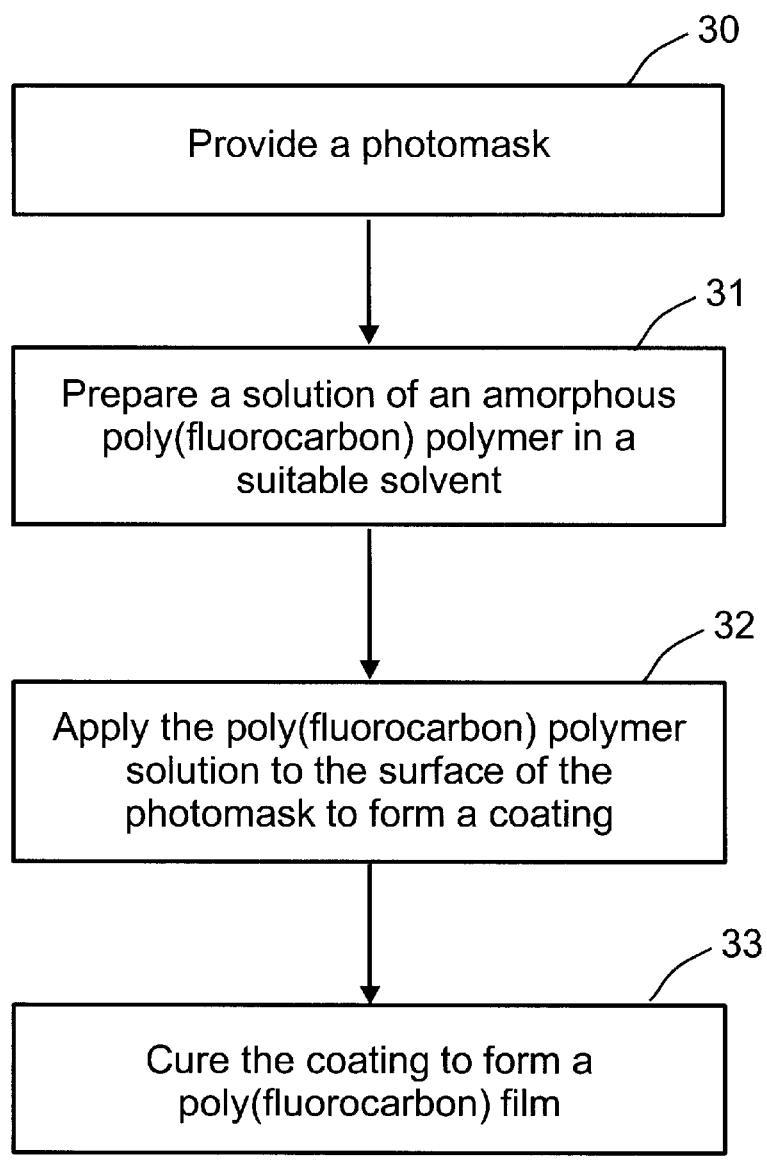
FIG. 4 is a flowchart depicting the steps of preparing a photomask according to the present invention.

FIG. 1 is a schematic depiction of a photomask 10 according to the present invention, shown in cross-section. The photomask consists of a transparent substrate 11, with the mask pattern 12 on the surface of the substrate. Often, the substrate is glass, particularly glass that is transparent to the illumination selected for the photolithographic process employed. Where the photolithographic process is highly critical and the highest quality is required, the substrate is typically highly pure quartz glass. Quartz glass substrates are most common in modern photolithography systems, however any other substrate that is suitable for application of a photomask pattern and use in photolithography is a suitable substrate for the purposes of the invention.

Photomask pattern 12 defines light-transmitting and non-light-transmitting portions of the photomask. The photomask is typically prepared by selective deposition of a mask material, or selective etching of a previously deposited mask material. One common mask material is chrome metal, but other mask materials are also appropriate for the purposes of the invention, including iron oxide, molybdenum silicide, or any other mask material that can define a circuit pattern for the purposes of photolithography. The pattern defined by the mask material is typically a circuit that is subsequently projected on a target, typically a semiconductor wafer, that has been covered with a photoresist.

In one aspect of the invention, the photomask incorporates phase shifting techniques. "Phase shifting" refers to the selective modulation of the phase of illumination light as it passes through the photomask to prevent the image of the pattern projected onto the target wafer from blurring. Typically, the use of phase shifting techniques improves resolution and depth of focus so that even small features of the photomask pattern are reproduced accurately on the target wafer. For example, the use of molybdenum suicide as a mask material allows some illumination light to pass through the pattern. However, the amount that passes through is too weak to expose the photoresist present on the target wafer, and is 180° out of phase with the light passing through the substrate itself. Interference at the edges of the pattern serves to sharpen the edges of the design when projected on the target. Another phase shifting technique utilizes selective etching of areas of the substrate, again creating destructive interference at the boundaries between the pattern and the substrate, sharpening the projected pattern.

The photomask of the invention is coated with a thin film of an amorphous poly(fluorocarbon) film, shown as 13 in FIG. 1. The poly(fluorocarbon) film is typically substantially transparent to the wavelength of light used to illuminate the pattern during photolithography, and typically completely covers at least the mask pattern present on the photomask surface. Any polymer of a fluorinated hydrocarbon that is capable of forming a protective film on the photomask is a suitable fluorinated polymer for the purposes of the invention. Preferred poly(fluorocarbons) include, but are not limited to, homopolymers or copolymers of perfluoro-2,2-dimethyl-1,3-dioxole (PDD), tetrafluoroethylene, chlorotrifluoroethylene, vinylidene fluoride, hexafluoropropylene, and trifluoroethylene. In one aspect, the poly(fluorocarbon) is a cyclized polymer obtained by copolymerization of perfluoro (alkenyl vinyl ethers). Alternatively, the poly(fluorocarbon) is a homopolymer or copolymer of perfluoro-2,2-dimethyl-1,3-dioxole (PDD), the structure of which is provided below. In another aspect of the invention, the amorphous poly(fluorocarbon) is a copolymer of PDD and one or more of a perfluoro (alkylvinyl ether), a vinyl fluoride, and a (perfluoroalkyl) ethylene. In yet another aspect of the invention, the amorphous poly(fluorocarbon) is a copolymer of PDD with perfluoro(butenyl vinyl ether) and optionally with a third comonomer that is a perhaloolefin or perfluoro(alkyl vinyl ether).

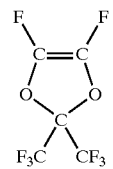

The chemical structure of PDD

Polymerization of PDD with other fluorinated hydrocarbons produces a variety of amorphous copolymers that typically possess multiple advantageous properties. These poly(fluorocarbon) polymers typically possess a high glass transition temperature, a high modulus, high strength, and exhibit low creep under compressive load. They typically also exhibit low refractive indices, possess excellent dielectric properties, and exhibit excellent chemical resistance. These amorphous polymers may be readily applied by solvent casting or spray coating, and so are well-suited to coat photomasks in order to confer resistance to contamination during lithography. The low dielectric of the polymer coating prevents small particulates from being attracted to, or adhering to, the photomask itself. In addition, the chemically inert character of the polymer coating prevents even the highly reactive species generated by UV illumination from reacting with the mask pattern itself.

A variety of amorphous fluorinated polymers suitable for the preparation of the photomasks of the invention are described in U.S. Pat. Nos. 4,399,264 to Squire (1983); 4,485,250 to Squire (1984); 4,754,009 to Squire (1988); 4,935,477 to Squire (1990); 5,276,121 to Resnick (1994); 5,326,839 to Resnick (1994); 5,353,368 to Resnick (1994); 5,324,889 to Resnick (1994); 5,338,608 to Resnick (1994); 5,310,838 to Hung et al. (1994); 5,354,910 to Hung et al. (1994); and 5,408,020 to Hung et al. (1995), each of which is hereby incorporated by reference. Suitable amorphous poly(fluorocarbons) for the purposes of the invention are commercially available under the trademarks TEFLON AF, particularly the fluoropolymers AF-1600 and AF-2400 (E. I. du Pont de Nemours and Company).

Particularly preferred fluorinated polymers for the preparation of the photomasks of the invention are commercially available under the trademark CYTOP (Asahi Glass Company). CYTOP poly(fluorocarbons) are obtained by copolymerization of perfluoro(alkenyl vinyl ethers), and exhibit excellent temperature and chemical resistance, a refractive index of 1.34, a dielectric constant of 2.1, UV and near-IR transmittance of greater than 95%, and CYTOP poly(fluorocarbons) are soluble in perfluorinated solvents and readily cast in very thin films using conventional coating technologies (spin coating, dip coating, etc.).

The poly(fluorocarbons) useful for preparing the photomasks of the invention are readily soluble in fluorinated hydrocarbon solvents, facilitating the application of thin films of the amorphous polymers to the photomask. Selected fluorinated solvents that are appropriate for preparing amorphous poly(fluorocarbon) solutions include perfluorinated cyclic ethers, or perfluorinated tirbutylamine, perfluorooctane, perfluorodecaline. Typically, the amorphous poly(fluorocarbon) is solubilized in a solvent that includes perfluoro(2-butyltetrahydrofuran). Suitable fluorinated solvents for preparing solutions of amorphous poly (fluorocarbons) are commercially available under the trademark FLUORINERT (Minnesota Mining And Manufacturing Company Corporation). Particularly useful solvents include FLUORINERT Electronic Liquid FC-43 and FLUORINERT Electronic Liquid FC-75.

The amorphous poly(fluorocarbon) is typically applied to the photomask using conventional coating techniques known in the art of semiconductor manufacture. The method of manufacturing a coated photomask is generally outlined at FIG. 4, and includes providing a suitable photomask, preparing a solution of the selected amorphous poly (fluorocarbon) polymer in a suitable solvent, applying the solution of polymer to the surface of the photomask to form a coating, and curing the coating to form a poly (fluorocarbon) film. Particularly suitable coating techniques include, without limitation, spray coating, meniscus coating, or spin coating.

Spray coating utilizes a spray application to apply a solution of the poly(fluorocarbon) to the photomask. In meniscus coating processes, the photomask to be coated is inverted and passed over a laminar flow of the poly (fluorocarbon) solution. Spin coating is a particularly useful application method, and typically utilizes a vacuum chuck to hold the photomask and spin it at high rpm while the poly(fluorocarbon) solution is applied to the center of the photomask. The thickness of the resulting film is controlled by the viscosity of the solution and the rotation rate of the photomask. Spin coating typically utilizes a solution of the selected polymer in a fluorocarbon solvent, as described above, at a solids content of about 1% to about 5%. In particular, a solution with a solids content of about 2% is particularly suitable for spin coating the photomask.

Although the coating of poly(fluorocarbon) polymer must be cured, the step of curing may occur at any temperature from room temperature up to a temperature of about 100° C. Where curing occurs at room temperature, it typically requires 8–12 hours. Where curing occurs at elevated temperatures, it may require as little as 10 minutes to be essentially complete. Any combination of curing temperature and curing time that produces a cured film with the desired film properties is a suitable combination of curing conditions for the purposes of the invention.

After curing, the resulting thin polymer film is typically about 100 Å to about 700 Å in thickness, more typically about 300 Å to about 400 Å in thickness. In general, the film thickness must only be sufficient to satisfactorily protect the surface of the photomask itself, while not so thick that effective transmission of the illumination light is compromised.

Articles prepared from amorphous poly(fluorocarbons), and their method of manufacture are described in U.S. Pat. Nos. 4,530,569 to Squire (1985); 4,948,851 to Squire (1990); 4,975,505 to Squire (1990); 4,982,056 to Squire (1991); 5,000,547 to Squire (1991); 4,977,025 to Squire (1990); 4,977,026 to Squire (1990); 4,977,008 to Squire (1990); 4,977,297 to Squire (1990); 4,973,142 to Squire (1990); 4,999,248 to Squire (1991); 4,985,308 to Squire (1991); 5,006,382 to Squire (1991); 5,296,283 to Froggatt (1994); 5,308,685 to Froggatt (1994); 5,076,659 to Bekiarian et al. (1991) and 5,051,114 to Nemser et al. (1991), each of which is hereby incorporated by reference.

Prior to using a photomask of the invention in a photolithographic process, it is typically outfitted with an optical pellicle to protect the surface of the photomask from particulate contamination, as described above. A schematic diagram of a photomask of the invention fitted with a pellicle is generally shown in FIG. 2, where pellicle frame 15 is shown supporting the pellicle membrane 16 at a distance about the surface of the amorphous poly(fluorocarbon) film 13.

The photomask of the invention is generally useful in any photolithographic process that currently utilizes a photomask. In one aspect of the invention, the photomask is used in contact printing, where the photomask is brought into direct physical contact with the target wafer before illumination. More typically, however, scan projection photolithography is used and the image of the mask pattern is projected at a reduced size on the target wafer. The photolithographic process is depicted schematically at FIG. 3, where the illuminating light from light source 25 is projected through the pellicle membrane by the condenser lens system 26. The image of the mask pattern 12 is projected via reduction lens system 27 onto the target wafer 20 with a photoresist coating 21.

Figure 5:
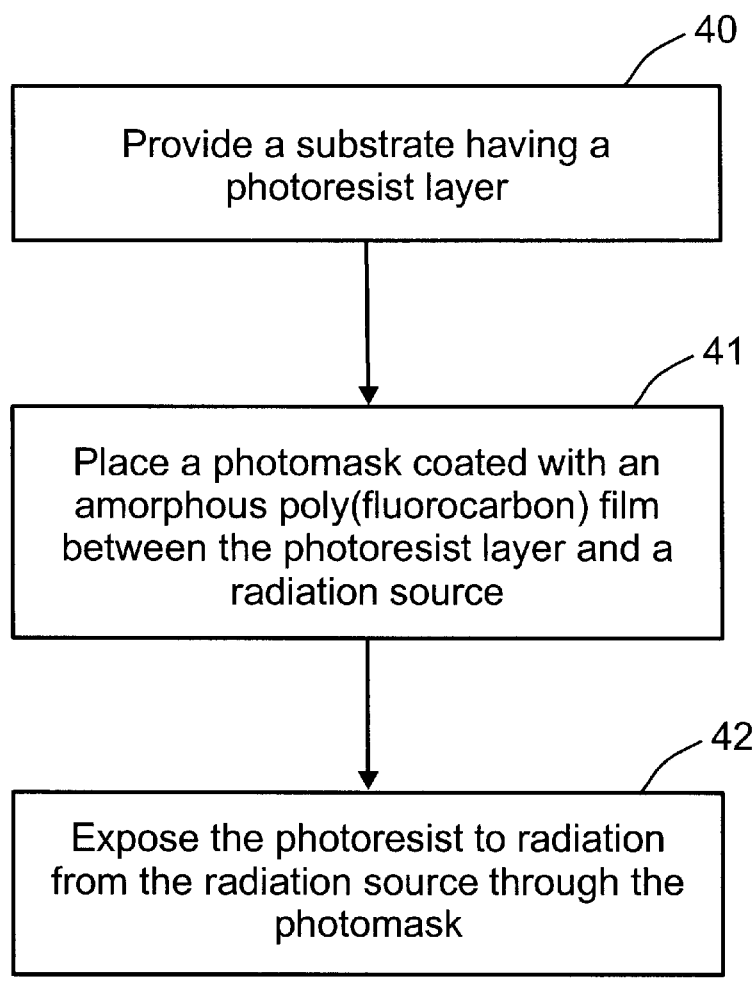
FIG. 5 is a flowchart depicting the steps of a photolithographic process using a photomask according to the present invention.

The photolithography process is outlined in the flowchart of FIG. 5, and includes providing a target substrate covered with a layer of photoresist, placing a photomask between the photoresist layer and a radiation source, where the photomask includes a substrate, a mask pattern on the surface of the substrate, and an amorphous poly(fluorocarbon) film on the surface of the substrate, and then exposing the layer of the photoresist to the radiation from the source through the photomask.

Although the present invention has been shown and described with reference to the foregoing operational principles and preferred embodiments, it will be apparent that those of skill in the art of semiconductor manufacture will be able to vary the details of photomask substrate composition, mask pattern composition, illumination wavelength, the photolithographic process, and other various changes in form and detail without departing from the spirit and scope of the invention. The present invention is intended to embrace all such alternatives, modifications and variances which fall within the scope of the appended claims.

What is claimed is:

1. A photomask, comprising:
   a transparent substrate;
   a mask pattern on a surface of said substrate defining transmitting and non-transmitting portions; and
   an amorphous poly(fluorocarbon) film on the surface of said substrate, the film covering the mask pattern.

2. The photomask of claim 1, where the transparent substrate is glass.

3. The photomask of claim 1, where the transparent substrate is quartz.

4. The photomask of claim 1, where either the mask pattern or the transparent substrate comprises a phase-shifting substance.

5. The photomask of claim 1, where the mask pattern defines a circuit.

6. The photomask of claim 1, where the amorphous poly(fluorocarbon) film is substantially transparent to ultraviolet light.

7. The photomask of claim 1, where the poly (fluorocarbon) film comprises a homopolymer or copolymer of perfluoro-2,2-dimethyl-1,3-dioxole or a perfluoro (alkenyl vinyl ether).

8. The photomask of claim 1, where the poly (fluorocarbon) film comprises a homopolymer or copolymer of one or more of perfluoro-2,2-dimethyl-1,3-dioxole, tetrafluoroethylene, chlorotrifluoroethylene, vinylidene fluoride, hexafluoropropylene, and trifluoroethylene.

9. The photomask of claim 1, where the poly (fluorocarbon) film comprises a copolymer of perfluoro-2, 2-dimethyl-1,3-dioxole and one or more of a perfluoro(alkyl vinyl ether), a vinyl fluoride, and a (perfluoroalkyl)ethylene.

10. The photomask of claim 1, where the poly (fluorocarbon) film is about 300 Å to about 400 Å in thickness.

11. The photomask of claim 1, further comprising an optical pellicle disposed on the surface of the substrate, the optical pellicle comprising a pellicle frame with a pellicle membrane mounted thereon, so that the poly(fluorocarbon) film is interposed between the pattern and the optical pellicle.

12. A method of applying a poly(fluorocarbon) film to a photomask, comprising the steps of:
   providing a photomask comprising a transparent substrate and a mask pattern on a surface of said substrate defining transmitting and non-transmitting portions;
   preparing a solution of an amorphous poly(fluorocarbon) polymer in a suitable solvent;
   applying the solution of amorphous poly(fluorocarbon) polymer to the surface of the photomask to form a coating; and
   curing the coating to form the poly(fluorocarbon) film.

13. The method of claim 12, where the poly(fluorocarbon) is a homopolymer or copolymer of one or more of perfluoro-2,2-dimethyl-1,3-dioxole, tetrafluoroethylene, chlorotrifluoroethylene, vinylidene fluoride, hexafluoropropylene, and trifluoroethylene.

14. The method of claim 12, where the solution of amorphous poly(fluorocarbon) polymer has a solids content of about 1% to 5%.

15. The method of claim 12, where the solvent comprises a perfluorinated hydrocarbon.

16. The method of claim 12, where the solvent comprises perfluorinated tributylamine, perfluorooctane, perfluorodecaline, or a perfluorinated cyclic ether.

17. The method of claim 12, where the solvent comprises a perfluoro(2-tetrahydrofuran).

18. The method of claim 12, where the step of curing comprises drying the coated photomask at a temperature between about room temperature and about 100° C.

19. The method of claim 12, where the step of applying the solution of amphous poly(fluorocarbon) polymer to the surface of the photomask comprises spin coating, spray coating, or meniscus coating.

20. A method of photolithography comprising the steps of:
   providing a substrate having a layer of photoresist thereon;
   placing a photomask between the layer of photoresist and a radiation source, the photomask comprising a transparent substrate, a mask pattern on a surface of said substrate defining transmitting and non-transmitting portions, and an amorphous poly(fluorocarbon) film on the surface of said substrate, the film covering the pattern
   exposing the layer of photoresist to radiation from the source through the photomask.

21. The method of claim 20, where the radiation has a wavelength of 248 nm, 193 nm, 157 nm or 13.5 nm.

22. The method of claim 20, where the photomask further comprises an optical pellicle, the optical pellicle comprising a pellicle frame and a pellicle membrane mounted thereon, the optical pellicle disposed on the surface of the substrate so that the poly(fluorocarbon) film is interposed between the mask pattern and the pellicle membrane pellicle, such that radiation from the source passes through the pellicle membrane before passing through the photomask.

* * * * *